United States Patent
Aitken

(10) Patent No.: US 8,347,728 B2
(45) Date of Patent: Jan. 8, 2013

(54) STRESS DETECTION WITHIN AN INTEGRATED CIRCUIT HAVING THROUGH SILICON VIAS

(75) Inventor: Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 253 days.

(21) Appl. No.: 12/805,025

(22) Filed: Jul. 7, 2010

(65) Prior Publication Data

US 2012/0006122 A1 Jan. 12, 2012

(51) Int. Cl.
*G01B 7/16* (2006.01)
(52) U.S. Cl. .......................................... 73/777; 73/760
(58) Field of Classification Search .................. 73/760, 73/777
See application file for complete search history.

(56) References Cited

U.S. PATENT DOCUMENTS

| | | | | |
|---|---|---|---|---|
| 5,903,343 A * | 5/1999 | Ning et al. | ................. | 356/241.1 |
| 7,434,465 B1 * | 10/2008 | Stewart | ...................... | 73/504.13 |
| 7,824,959 B2 * | 11/2010 | Lee et al. | ...................... | 438/109 |
| 7,863,714 B2 * | 1/2011 | Diamond et al. | ............. | 257/660 |
| 8,110,415 B2 * | 2/2012 | Knickerbocker et al. | ....... | 438/15 |

OTHER PUBLICATIONS

Val et al., "Stacking Technique of Known Good Rebuilt Wafers Without Thru-Silicon Via Commercial Applications", *EPTC 2008 Singapore*, 7 pages.

* cited by examiner

*Primary Examiner* — Max Noori
(74) *Attorney, Agent, or Firm* — Nixon & Vanderhye P.C.

(57) ABSTRACT

An integrated circuit 2 is formed of multiple wafer layers 4, 6, 8, 10 arranged in a stack and connected with through silicon vias 12. Mechanical strain sensors 26, 28, 30, 32 in the form of ring oscillators are provided proximal to the through silicon vias 12 and detect mechanical strain associated with the through silicon via 12. The measured mechanical strain may be used to dynamically adjust operating parameters of the integrated circuit either as a whole or in regions where the mechanical strain is detected. The operating parameters adjusted can include clock frequency, operating voltage and heat generation.

21 Claims, 6 Drawing Sheets

STRESS DETECTION WITHIN AN INTEGRATED CIRCUIT HAVING THROUGH SILICON VIAS

BACKGROUND OF THE INVENTION

1. Field of the Invention

This invention relates to the field of integrated circuits. More particularly, this invention relates to integrated circuits formed of a stack of wafer layers interconnected by a plurality of through silicon vias.

2. Description of the Prior Art

FIGS. 1, 2 and 3 of the accompanying drawings schematically illustrate one example of an integrated circuit formed of a plurality of wafer layers interconnected with through silicon vias (TSVs). FIG. 1 illustrates an integrated circuit 2 comprising four wafer layers 4, 6, 8, 10 with through silicon vias 12 providing electrical connections between the wafer layers 4, 6, 8, 10. This type of technology allows more compact devices to be produced. Furthermore, the speed of communication between the wafer layers 4, 6, 8, 10 is higher than is typically achieved between separate integrated circuits each formed of one wafer layer and interconnected with a signal bus.

FIG. 2 illustrates a through silicon via used to provide an electrical connection between two wafer layers 14, 16. Each wafer layer 14, 16 comprises a silicon substrate with multilayer circuitry formed thereon using conventional lithographic techniques. In order to provide an electrical connection between wafer layers 14, 16, a through silicon via 12 is provided by etching the silicon substrate of the wafer layer 16 to produce a hole therein. This hole is then filled with a conductive material, such as copper (or tungsten cored copper) extending through the silicon substrate, connecting with one or more portions within the multilayer circuitry and protruding from the silicon substrate. The adjacent wafer layer 14 has a contact pad 18 formed on the upper surface of the multilayer circuitry and this makes mechanical contact with the conductive material protruding from the through silicon via 12. Adhesive bonding is used to hold the wafer layers 14, 16 together. It will be appreciated that FIG. 2 illustrates a single electrical connection and that in reality a large number of such connections will typically be provided between wafer layers to pass the desired electrical signals between the wafer layers 14, 16. There are other ways of forming a through silicon via, such as drilling holes which are then filled at different points in the manufacturing process. These different ways of forming the through silicon vias do not materially effect the invention.

FIG. 3 schematically illustrates a wafer layer 20 having an array of through silicon vias 12 formed upon its surface. These through silicon vias are illustrated as having a regular layout, but it will be appreciated that this is not a requirement and the through silicon vias 12 could be more randomly located across the surface of the wafer layer 20. The through silicon vias 12 are typically physically large structures (e.g. approximately 1 micrometre in diameter) when compared to the geometry size of the circuit elements within the multilayer circuitry of the wafer layers (approximately a few tens of □ anometers). It is known that the mechanical engagement of the through silicon vias 12 between wafer layers results in mechanical strain within the wafer layers. This mechanical strain can alter the electrical properties of the circuitry, e.g. speed up or slow down the circuitry, change threshold voltages etc. These changes in the electrical properties can result in incorrect operation of the circuitry if it is located too close to a through silicon via 12 which is subject to a high level of mechanical strain. For this reason, it is known to define keep out areas (KOAs) 22 surrounding each of the through silicon vias and form the wafer layers such that no circuitry which may be perturbed by the strain-induced electrical changes is formed within the keep out areas 22.

While this approach may avoid incorrect operation due to strain induced changes as a result of the use of through silicon vias, there are a number of disadvantages and problems associated with the keep out areas 22. As the number of through silicon vias 12 it is desired to provide increases, then the proportion of the area of the wafer layer 20 which is occupied by the keep out areas 22 increases. When the number of connections is relatively small, e.g. connecting between a wafer layer carrying processing logic and a wafer layer carrying only memory, then the overhead of the keep out areas 22 may be accommodated. However, in circumstances where a higher number of electrical connections provided by through silicon vias 12 is desired, such as connecting between two wafer layers each carrying active processing logic (e.g. two wafer layers carrying different portions of a microprocessor), then the area of the keep out areas may be so large a proportion of the area of the wafer layers 20 that there is insufficient space to accommodate the processing logic required on the wafer layers.

SUMMARY OF THE INVENTION

Viewed from one aspect the present invention provides an integrated circuit comprising:

a stack of wafer layers, each of said wafer layers being separately formed and then stacked to form said stack;

a plurality of through silicon vias, each of said through silicon vias extending through a subject wafer layer and containing a conductive material to provide an electrical connection with an adjacent wafer layer within said stack; and at least one strain sensor disposed within one of said wafer layers proximal to a through silicon via, said strain sensor generating a strain signal indicative of mechanical strain associated with said through silicon via within said one of said wafer layers.

The present technique recognises that the provision of strain sensors within the wafer layers proximal to the through silicon vias permits the actual strain within the wafer layers to be measured, rather than basing the design upon safe but area-wasteful principle of keep out areas 22 surrounding every through silicon via 12 irrespective of whether or not there is actually any mechanical strain in the proximity of the through silicon vias 12. The overhead of the provision of the strain sensors is more than compensated for by the ability to use areas of the wafer layer closer to the through silicon vias 12 to accommodate processing circuitry.

It will be appreciated that whilst it is possible to use a single strain sensor to measure the strain associated with a through silicon via, more accurate results may be achieved by surrounding a through silicon via with a plurality of strain sensors and orienting these such that at least one of the strain sensors will generate a strain signal indicative of mechanical strain due to that through silicon via irrespective of the orientation of that mechanical strain.

One convenient arrangement utilises two pair of strain sensors with each pair of strain sensors having one sensor either side of a point at which the through silicon via intersects the wafer layer. This can, for example, be considered as providing strain sensors in the North, South, East and West directions surrounding a through silicon via 12.

The strain signals produced by the strain sensors may be input to comparison circuitry and compared with a reference value to measure mechanical strain within the wafer layers. An alternative, which is potentially more resistant to variation within integrated circuits, is to compare strain signals from a plurality of strain sensors against each other as a way of measuring mechanical strain. If one of the strain signals starts to deviate significantly from the remainder, then this can indicate mechanical strain.

The strain sensors may be provided within the wafer layer through which the through silicon via extends and/or to the adjacent wafer layer to which the through silicon via makes electrical contact. Either or both of these wafer layers may be subject to mechanical strain as a consequence of the through silicon via.

In some embodiments the strain signals which are detected may be used to control one or more operating parameters of the integrated circuit. Such embodiments provide a feedback mechanism whereby detected mechanical strain can be used to adjust the operating parameters in a manner to avoid problems associated with that mechanical strain. Examples of the operating parameters which may be adjusted are the operating clock frequency, the operating voltage or the heat generation (e.g. a consequence of the voltage, frequency or assigned workload) associated with the integrated circuit as a whole or a region of the integrated circuit, whether that be a particular wafer layer or a region within a wafer layer. This feedback from the mechanical strain sensed near a through silicon via to the operating parameters of the integrated circuit permits areas of the wafer layers closer to the through silicon vias to be used for processing circuitry and the effects of mechanical strain dealt with as they are detected. A particular area subject to mechanical strain may be taken out of use or given a lighter workload to mitigate the mechanical strain which has arisen, e.g. a lighter workload may reduce the temperature of the region surrounding the through silicon via concerned and accordingly reduce mechanical strain associated with the thermal expansion and/or thermal gradients that can arise.

The operating parameters could be set during a manufacturing test procedure for the integrated circuit once formed. The operating parameters may also be dynamically adjusted during operation of the integrated circuit to take account of mechanical strain which may temporarily or permanently arise during ongoing operation.

The controlling of the operating parameters of the integrated circuit can be complex, e.g. deciding how to allocate workload between different primitive processors in a highly parallel graphics processing unit, and accordingly this is a task well suited for control by software. In order to facilitate software control the strain sensors can utilise memory mapped registers into which data values indicative of the strain signals are written such that the software can read these data values and take appropriate controlling action (e.g. not allocating any tasks to a graphics processing primitive processor which is detected as being subject to mechanical strain). Differences between mechanical strain associated with different through silicon vias may also be detected and used to identify more widespread variations in mechanical strain across a wafer layer or within an integrated circuit. As an example, a hot spot within a stack may extend both within the wafer layers and between wafer layers. The source of the heat generation and induced mechanical stress may be at the core of the hot spot and identified more readily by considering the strain signals received on a wider basis than a single region.

The strain sensors can take a variety of different forms. One form of strain sensor well suited to the task is a ring oscillator configure such that the oscillation frequency varies the mechanical strain associated with the through silicon via proximal to which the ring oscillator is disposed.

The strain sensors of the present technique are well suited for use in association with temperature sensors disposed within the wafer layers to monitor temperature changes. The combination of strain sensing and temperature sensing is beneficial in efficiently managing the operating parameters of the integrated circuit and/or assuring reliable functioning.

As mentioned above, the mechanical strain within the integrated circuit may be dynamically measured on an ongoing basis during field operation of the integrated circuit. The strain may also be measured during a manufacturing test operation used when the integrated circuit has first been manufactured to determine its correct functioning. Such a manufacturing test phase of mechanical strain measuring can be used to sort integrated circuits produced into classes of integrated circuits each having different ranges of measured mechanical strain characteristics. The mechanical strain characteristics will typically vary from instance to instance of manufactured integrated circuits and integrated circuits with lower levels of mechanical strain will typically be better performing and more reliable. Sorting the integrated circuits manufactured into different classes each having a different range of measured mechanical strain characteristics can be considered to be strain binning the integrated circuits. Those integrated circuits with more desirable strain characteristics can be sold for a premium price compared to those with less desirable strain characteristics.

The ongoing variation of mechanical strain with an integrated circuit can be measured with time. A gradual build up of mechanical strain and/or rapid changes in the levels of mechanical strain can provide a good indication of imminent failure. Thus, the mechanical strain sensors can provide a measurement of wear out of the integrated circuit, reliability of the integrated circuit or the likelihood of imminent failure of the integrated circuit.

Viewed from another aspect the present invention provides an integrated circuit comprising:

a stack of wafer layer means, each of said wafer layers being separately formed and then stacked to form said stack;

a plurality of through silicon via means, each of said through silicon via means extending through a subject wafer layer means and containing a conductive material to provide an electrical connection with an adjacent wafer layer means within said stack; and at least one strain sensing means for sensing strain and disposed within one of said wafer layer means proximal to a through silicon via means, said strain sensor means generating a strain signal indicative of mechanical strain associated with said through silicon via means within said one of said wafer layer means.

Viewed from a further aspect the present invention provides a method of operating an integrated circuit having a stack of wafer layers, each of said wafer layers being separately formed and then stacked to form said stack and a plurality of through silicon vias, each of said through silicon vias extending through a subject wafer layer and containing a conductive material to provide an electrical connection with an adjacent wafer layer within said stack, said method comprising the steps of:

providing at least one strain sensor disposed within one of said wafer layers proximal to a through silicon via; and generating with said strain sensor a strain signal indicative of mechanical strain associated with said through silicon via within said one of said wafer layers.

Viewed from a further aspect the present invention provides a method of sorting integrated circuits, said method comprising the steps of:

providing a plurality of integrated circuits, each integrated circuit having a plurality of wafer layers electrically interconnected by a plurality of through silicon vias;

for each integrated circuit of said plurality of integrated circuits, measuring mechanical strain within at least one of said wafer layers of said integrated circuit with a strain sensor formed proximal to a through silicon via; and at least partially in dependence upon said measured mechanical strain, dividing said plurality of integrated circuits into a plurality of classes of integrated circuits having respective different ranges of mechanical strain characteristics.

The above, and other objects, features and advantages of this invention will be apparent from the following detailed description of illustrative embodiments which is to be read in connection with the accompanying drawings.

DESCRIPTION OF EMBODIMENTS

Figure 4:
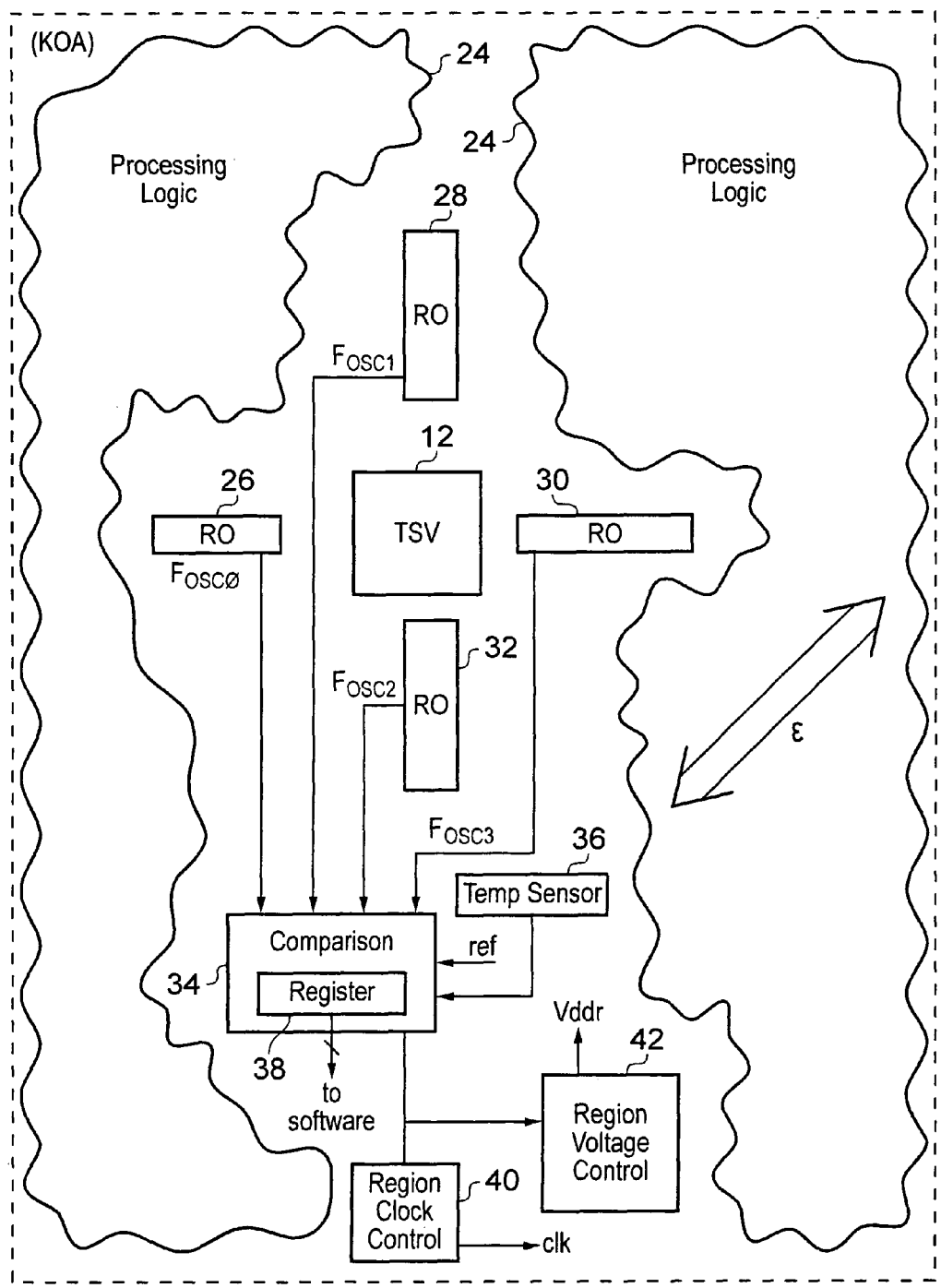
FIG. 4 schematically illustrates a region surrounding a through silicon via within a wafer layer incorporating strain sensor mechanisms.

FIG. 4 schematically illustrates the region within a wafer layer of an integrated circuit surrounding a through silicon via 12. This through silicon via 12 would normally be surrounded by a keep out area KOA in which useful processing circuitry 24 would not be located as it could be subject to malfunction due electrical changes resulting from mechanical strain induced by the presence of the through silicon via 12. In accordance with the present techniques, this area proximal to the through silicon via 12 is utilised for useful processing circuitry 24. Strain sensors comprising four ring oscillators 26, 28, 30, 32, are provided surrounding the through silicon via 12. These ring oscillators 26, 28, 30, 32 are provided in pairs with each pair being disposed on an opposite side of the point at which the through silicon via 12 intersects the plane of the wafer layer. Thus, the ring oscillators 26, 28, 30, 32 can be considered as being provided in the four cardinal directions surrounding the through silicon via 12. The frequency of oscillation of these ring oscillators 26, 28, 30, 32 is measured by comparison circuitry 34. Mechanical strain ε will result in a change in the oscillation frequency of the ring oscillators. This can be detected by the comparison circuitry 34 by comparing the received oscillation frequencies with a predetermined reference value ref Alternatively, the different oscillation frequencies detected from the different strain sensors 26, 28, 30, 32 can be compared against each other and a variation of any of these detected oscillation frequencies relative to the others be used as an indication of mechanical strain altering the behaviour of the ring oscillator concerned.

The temperature sensor 36 (e.g. a ring oscillator whose frequency varies with temperature) may be provided in association with the comparison circuitry 34 to provide a measure of the local temperature of the region surrounding the through silicon via 12. Temperature variations can give rise to thermal contraction and expansion that in turn induces mechanical strain in the vicinity of a through silicon via 12. Thus, the local temperature as measured by the temperature sensor 36 is a useful in determining what variations in the operating parameters of the region surrounding the through silicon via 12 may be desirable. The comparison circuitry 34 includes a memory mapped register 38 into which data values indicative of the measured strain signals and the measured temperature are written by the comparison circuitry 34. These data values may then be read by software in order that analysis of the measure strain signals can be more conveniently performed. The comparison circuitry 34 is also linked to a clock controller 40 and a voltage controller 42 which serve to control the local clock signals clk and the local supply voltage Vddr used by the region surrounding the through silicon via 12. The comparison circuitry 34 may dynamically adjust the clock signals clk and the local voltage Vddr if strain is detected. The strain may inappropriately speed up the processing in which case the clock should be slowed down. Processing might also be slowed down by reducing the operating voltage, which would also have the effect of reducing the power consumed and the heat generated. The software monitoring the overall behaviour of the integrated circuit can write control values into the memory mapped register 38 which then control the clock controller 40 and the voltage controller 42 such that the software can influence the local clock and local voltage of the regions to perform its desired control.

Figure 1:
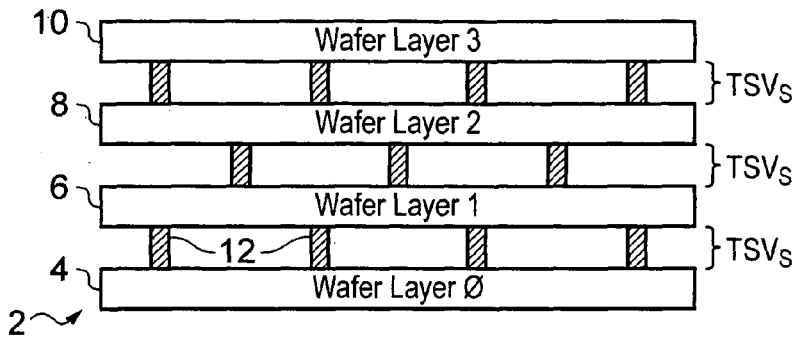
FIGS. 1, 2 and 3 schematically illustrate known techniques for producing integrated circuits comprising a stack of wafer layers.
Figure 2:
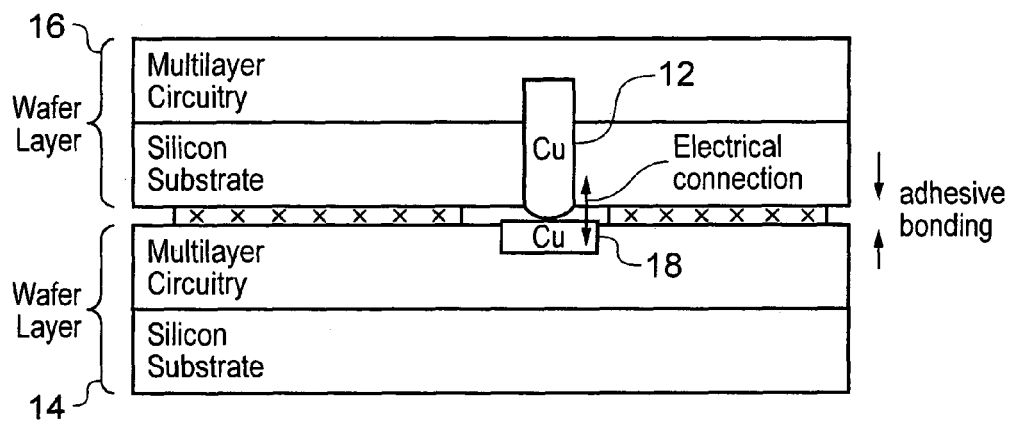
Figure 3:
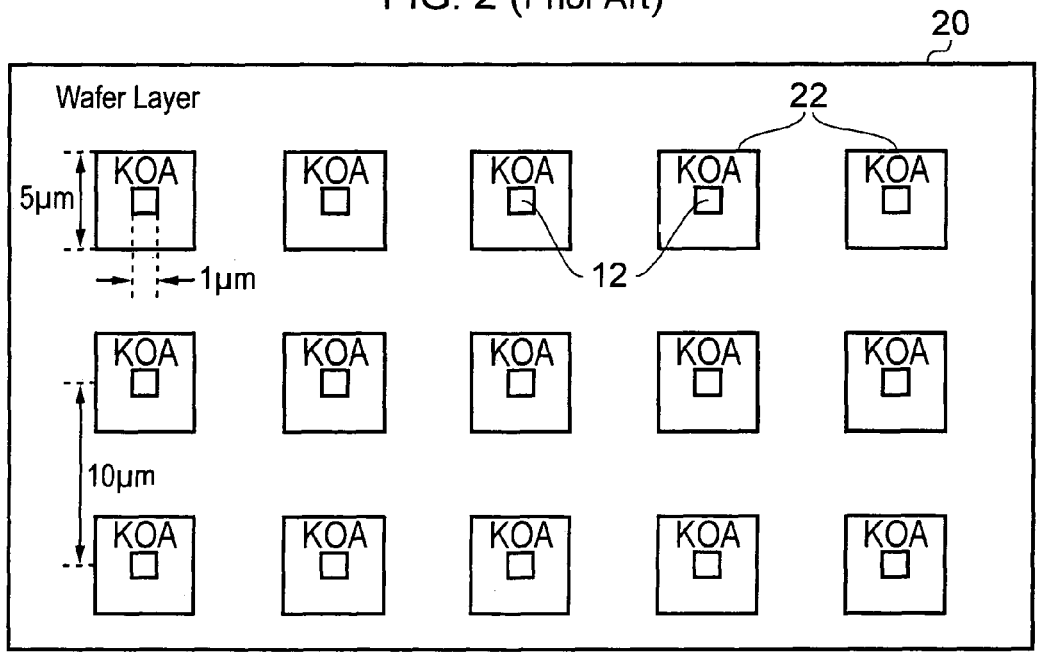

It will be appreciated that the integrated circuit is formed of multiple wafer layers arranged in a stack. These wafer layers could be stacked as complete wafers or when the wafers have been into separate circuit portions which are then assembled into stacks. The present techniques are not limited to the ways of forming through silicon vias discussed previously in relation to FIGS. 1 to 3 and may be applied more generally to any integrated circuit formed of multiple layers assembled into a stack with connections being provided between the layers by through silicon vias.

Figure 5:
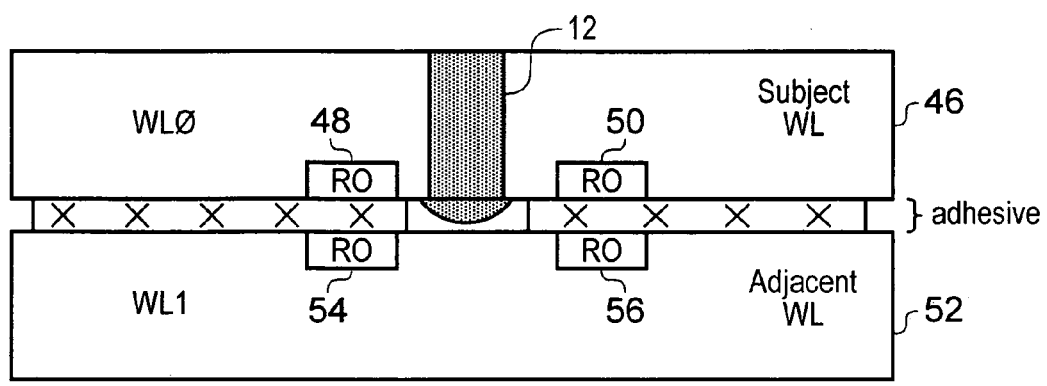
FIG. 5 schematically illustrates possible locations of strain sensors.

FIG. 5 illustrates one possible arrangement of strain sensors associated with a through silicon via 12. Proximal to the through silicon via 12 within the subject wafer layer 46 containing the through silicon via 12 there may be provided strain sensors 48, 50. Mechanical strain due to the through silicon via 12 may be induced within the subject wafer layer 46 itself. It is also possible that the through silicon via 12 will induce mechanical strain within the adjacent wafer layer 52 proximal to the through silicon via 12. Accordingly, strain sensors 54 and 56 may be provided in the adjacent wafer layer proximal to the through silicon via 12.

Figure 6:
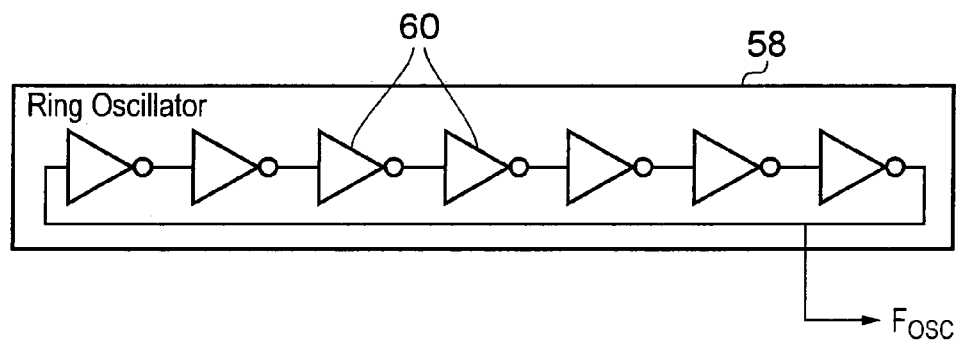
FIG. 6 schematically illustrates a flow diagram of a strain binning technique for sorting manufactured integrated circuits into classes depending upon their strain characteristics.

FIG. 6 illustrates one example form of a strain sensor. This example form is a ring oscillator 58 formed of an odd number of invertors 60 connected in series. The propagation delay through the invertors results in an oscillating signal passing round the chain of invertors 60 with a frequency determined by the delay characteristics of the invertors 60. The delay characteristics of the invertors 60 will be influenced by the mechanical strain to which the gates forming the invertors 60 are subject. Typically, if a gate is subject to mechanical strain, then the carrier mobility will increase and the speed of operation of the gate will increase. Thus, mechanical strain may be detected in some forms of the strain sensor 58 by an increase in the oscillation frequency detected. It will be appreciated that this is only one example of a strain sensor and that other forms of strain sensor may be used.

Figure 7:
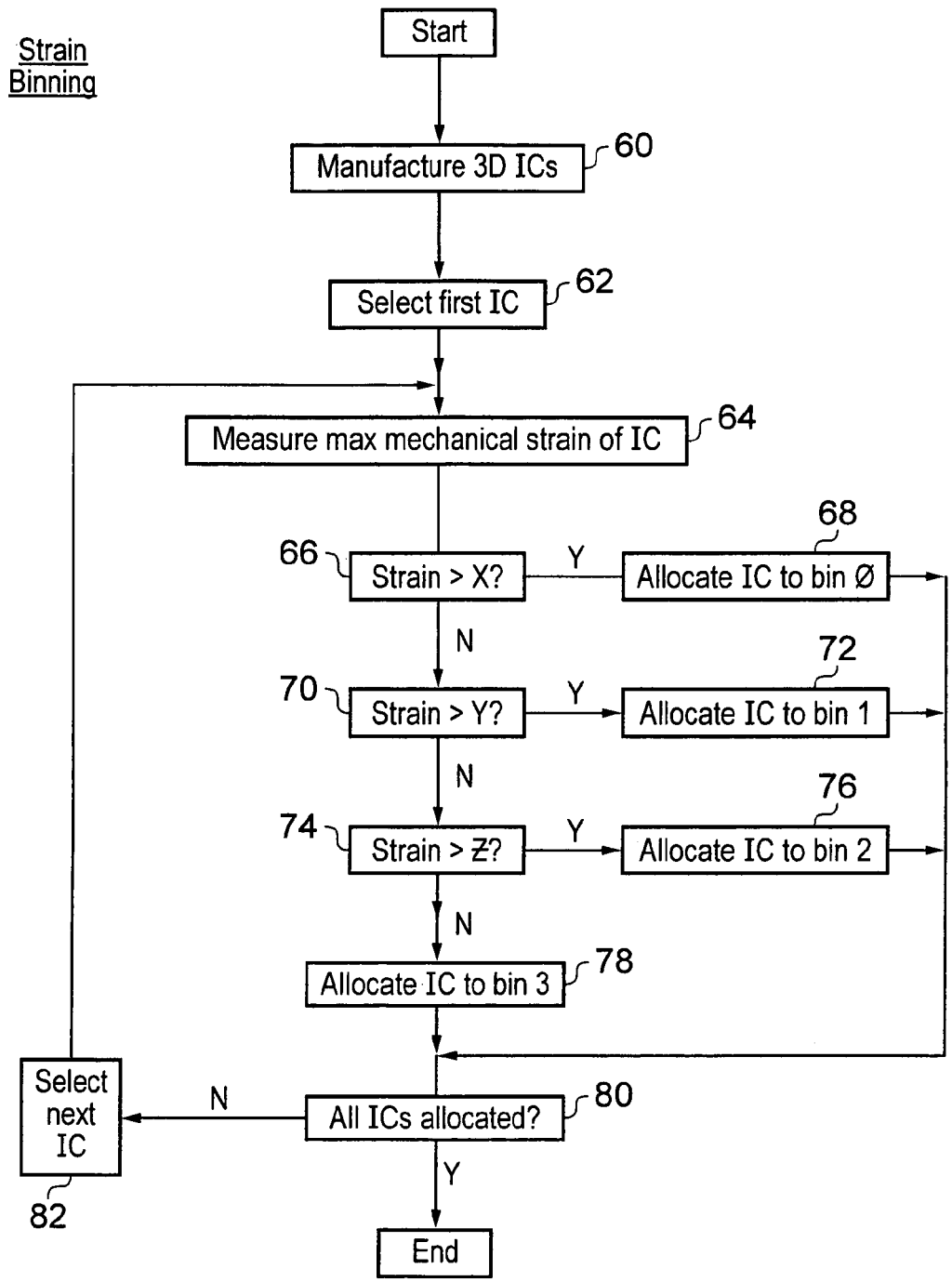
FIG. 7 is a flow diagram schematically illustrating strain binning.

FIG. 7 is a flow diagram schematically illustrating strain binning. Strain binning may be considered as a process of sorting a plurality of integrated circuits into different classes at least partially depending upon their measured strain characteristics. These different classes may be suitable for different uses. As an example, integrated circuits with relatively high degrees of measured mechanical strain may not be suitable for use in circumstances where high reliability is critical (e.g. within a satellite), but may be suitable for use in circumstances where lower cost is a priority (within a disposable one-time-use product). The different classes of integrated circuit into which the manufactured integrated circuits are sorted may be subject to different pricing. The manufacturer may be able to charge a higher price for integrated circuits which are measured as having low levels of mechanical strain compared to those measured as having high levels of mechanical strain. The binning may be based upon a combination of other parameters including strain, such as performance, power, etc.

At step 60 a group of integrated circuits formed of a plurality of wafer layers as previously discussed are manufactured. At step 62 the first integrated circuit from this group is selected for testing. Step 64 measures the maximum mechanical strain associated with any of the strain sensors surrounding the through silicon vias within the integrated circuit selected. It may be that the integrated circuits are sorted depending upon their average measured mechanical strain or their maximum measured mechanical strain. Both measurements can have different forms of significance. Some integrated circuits may be able to deal with isolated failures of particular regions and accordingly average mechanical strain is more significant, whereas in other integrated circuits if a single region fails then this can be critical and accordingly the maximum mechanical strain measured is more significant.

Step 66 determines whether or not the measured strain is greater than a first threshold. This can be a high value corresponding to the class of integrated circuits having the highest range of measured mechanical strain. If the integrated circuit is measured to have a strain exceeding this threshold, then it is allocated to bin 0 at step 68. Step 70 determines whether or not the measured strain falls above a second threshold. If the measured strain does fall above the second threshold then step 72 allocates the individual integrated circuit to bin 1. This process is repeated at steps 74 and 76 for a third threshold with integrated circuits having measured characteristics exceeding this third threshold being allocated to bin 2. Finally, the integrated circuits with the lowest level of measured mechanical strain qualify for inclusion within bin 3 at step 78.

Step 80 determines whether all of the integrated circuits have now been sorted into their different classes. If integrated circuits remain to be sorted, then step 80 selects the next integrated circuit and returns processing to step 64.

Figure 8:
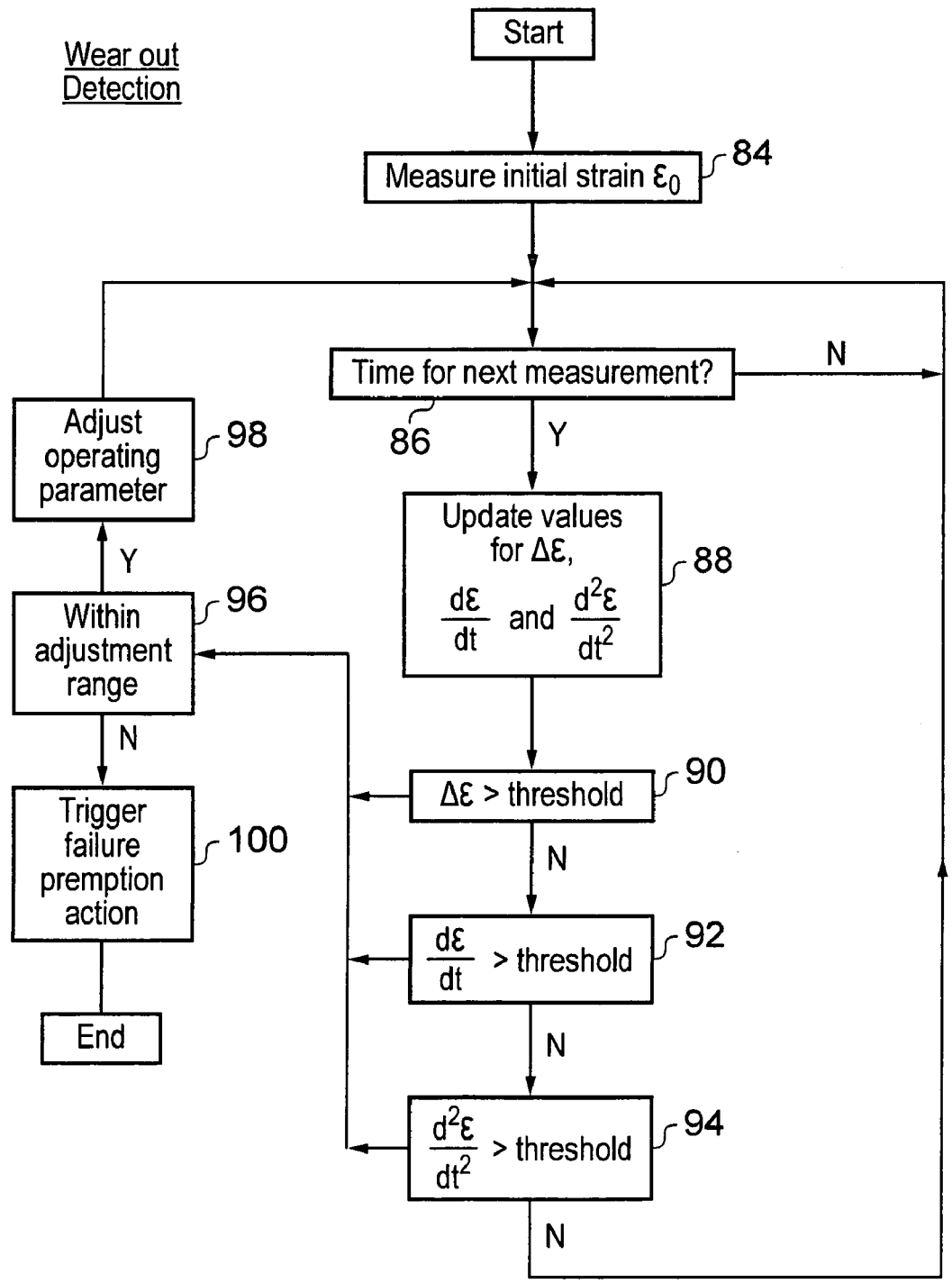
FIG. 8 is a flow diagram schematically illustrating how strain measurement can be used as part of wear out detection.

FIG. 8 is a flow diagram schematically illustrating how the measured strain associated with through silicon vias can be used as a method of wear out detection. At step 84 an initial value of the strain is measured. Step 86 waits for a predetermined time until a next measurement is to be made. Step 88 updates values for a change in the measured mechanical strain, a rate of change in the measure of mechanical strain and then a rate of change in the rate of change of measured mechanical strain. Steps 90, 92 and 94 then compare the updated values calculated at step 88 with respective threshold values to determine if any of these thresholds have been exceeded. The exceeding of any of these thresholds may indicate wear out of the integrated circuit, or at least the portion surrounding the through silicon via near where the measurement is being made. If none of the thresholds are exceeded, then processing returns to step 86. If any of the thresholds is exceeded, then processing proceeds to step 96 where a determination is made as to whether or not the range of adjustments to the operating parameters of the integrated circuit has been fully exploited. It may be that the clock frequency or operating voltage have already been adjusted to the maximum permissible degree to compensate for previously detected wear out. However, if adjustment is still possible to address the potential wear out detected, then processing proceeds to step 98 where the relevant operating parameter is adjusted. If adjustment is not possible, then processing proceeds to step 100 where failure pre-emption action is initiated, such as gracefully ceasing the processing operations and indicating the error to a user.

It will be appreciated that the updated values shown in FIG. 8 are only one example of the ways in which the measured strain may be processed to detect wear out, reliability, imminent failure operation outside characterised temperature/voltage range or an abrupt change in stress parameter(s). Different techniques are also possible.

Figure 9:
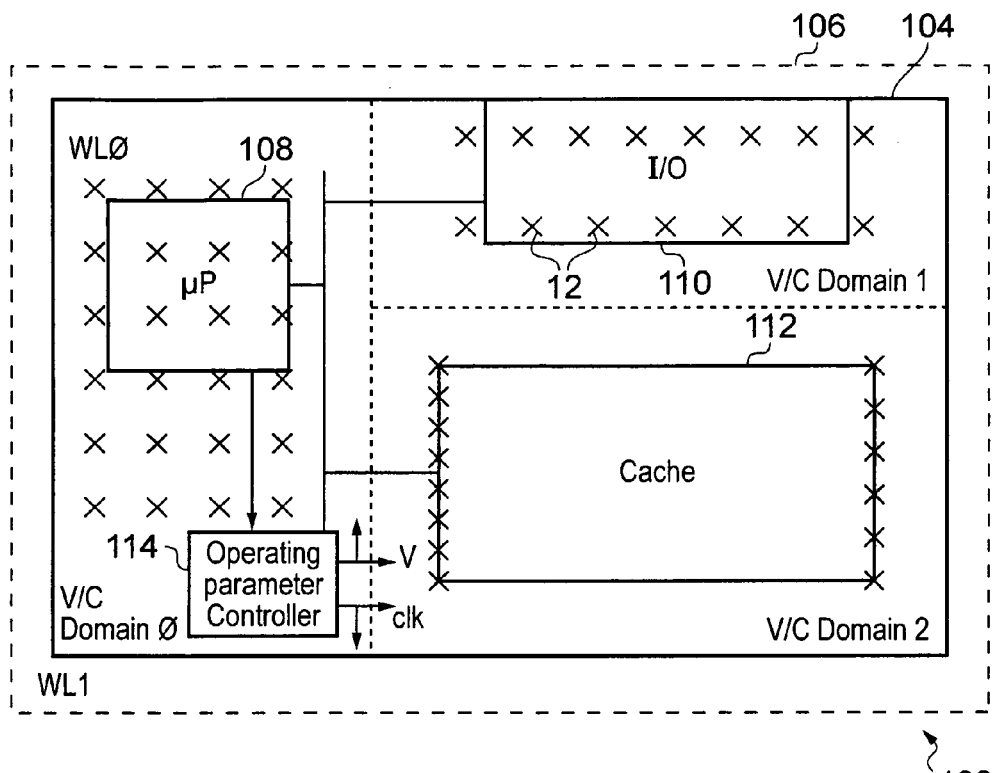
FIG. 9 schematically illustrates an integrated circuit with multiple clock and voltage domains within one of the wafer layers.

FIG. 9 schematically illustrates an integrated circuit 102 formed of two wafer layers namely a first wafer layer 104 overlying a second wafer layer 106. The first wafer layer 104 contains three voltage and clock domains respectively including a processor core 108, input/output circuitry 110 and a cache memory 112. The second wafer layer 106 may contain the bulk memory of the integrated circuit 102, e.g. bulk DRAM memory. Through silicon vias 12 are provided at different positions and electrically connect the first wafer layer 104 to the second wafer layer 106. Associated with each of these through silicon vias 12 is strain sensing circuitry as previously discussed. The strain sensing circuitry may be read by software executed by the processor core 108 with the measured strain values analysed to detect potential problems. The operating parameters of the different voltage and clock domains can then be adjusted under software control by the operating parameter controller 114. As an example, if mechanical strain is detected as being built up in the area corresponding to the processor core 108, then the clock frequency of the processor core 108 can be reduced to lower its temperature of operation so as to mitigate the build up of the mechanical strain which could give rise to incorrect operation. When the mechanical strain reduces the clock frequency can be increased again if this is possible without resulting in another build up in mechanical strain. The hot spots within an integrated circuit wafer layer may be localised and may be processing load dependent in a manner which makes such dynamic control and adjustment desirable.

Figure 10:
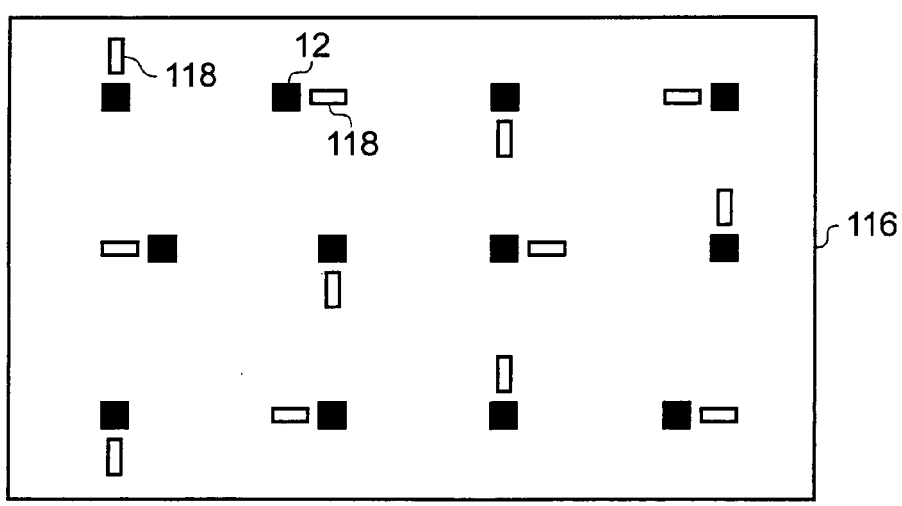
FIG. 10 illustrates a possible arrangement of strain sensors around through silicon vias of a wafer layer.

FIG. 10 schematically illustrates a wafer layer 116 including through silicon vias each having a ring oscillator 118 positioned proximal thereto. The ring oscillators are disposed with different orientations for different through silicon vias 12. Each of the ring oscillators will be more sensitive to mechanical strain in a direction dependent upon its particular orientation. Thus, mechanical strain around a particular through silicon via 12 may not be detected by the ring oscillator associated with that through silicon via 12, but may be detected by an adjacent ring oscillator 118 with an orientation more suited to detecting the direction of the mechanical strain concerned. It will be appreciated that the number of strain sensors and the orientation and positioning of the strain sensors around the through silicon vias 12 may vary. The strain sensors may be aligned to particular directions relative to the crystal lattice of the material from which the wafer layers 116 are formed. Mechanical strain in directions associated with particular lattice vectors may be more important than mechanical strain associated with other directions and accordingly it may be desirable to align the strain sensors with the lattice vectors to which there is the greatest sensitivity with respect to mechanical strain.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. An integrated circuit comprising:
   a stack of wafer layers, each of said wafer layers being separately formed and then stacked to form said stack;
   a plurality of through silicon vias, each of said through silicon vias extending through a subject wafer layer and containing a conductive material to provide an electrical connection with an adjacent wafer layer within said stack; and
   at least one strain sensor disposed within one of said wafer layers proximal to a through silicon via, said strain sensor generating a strain signal indicative of mechanical strain associated with said through silicon via within said one of said wafer layers, wherein said through silicon via is surrounded by a plurality of strain sensors disposed such that, independently of a direction of said mechanical strain, at least one of said plurality of strain sensors generates a strain signal indicative of said mechanical strain, wherein said through silicon via is surrounded by two pairs of strain sensors, each pair of strain sensors having one sensor one either side of a point at which said through silicon via intersects said one of said wafer layers.

2. An integrated circuit comprising:
   a stack of wafer layers, each of said wafer layers being separately formed and then stacked to form said stack;
   a plurality of through silicon vias, each of said through silicon vias extending through a subject wafer layer and containing a conductive material to provide an electrical connection with an adjacent wafer layer within said stack; and
   at least one strain sensor disposed within one of said wafer layers proximal to a through silicon via, said strain sensor generating a strain signal indicative of mechanical strain associated with said through silicon via within said one of said wafer layers, comprising comparison circuitry and wherein said strain signal input to said comparison circuitry, said comparison circuitry detecting a difference between said strain signal and a reference value to measure mechanical strain within said one of said wafer layers.

3. An integrated circuit comprising:
   a stack of wafer layers, each of said wafer layers being separately formed and then stacked to form said stack;
   a plurality of through silicon vias, each of said through silicon vias extending through a subject wafer layer and containing a conductive material to provide an electrical connection with an adjacent wafer layer within said stack; and
   at least one strain sensor disposed within one of said wafer layers proximal to a through silicon via, said strain sensor generating a strain signal indicative of mechanical strain associated with said through silicon via within said one of said wafer layers, comprising comparison circuitry and a plurality of strain sensors generating a plurality of strain signals input to said comparison circuitry and wherein said comparison circuitry compares said plurality of strain signals to measure mechanical strain within said one of said wafer layers.

4. An integrated circuit comprising:
   a stack of wafer layers, each of said wafer layers being separately formed and then stacked to form said stack;
   a plurality of through silicon vias, each of said through silicon vias extending through a subject wafer layer and containing a conductive material to provide an electrical connection with an adjacent wafer layer within said stack; and
   at least one strain sensor disposed within one of said wafer layers proximal to a through silicon via, said strain sensor generating a strain signal indicative of mechanical strain associated with said through silicon via within said one of said wafer layers, wherein said strain signal is used to control one or more operating parameters of said integrated circuit.

5. An integrated circuit as claimed in claim 4, wherein said one or more operating parameters are one or more of:
   an operating clock frequency of said integrated circuit;
   an operating clock frequency of a region of said one of said wafer layers surrounding said through silicon via;
   an operating voltage of said integrated circuit;
   an operating voltage of a region of said one of said wafer layers surrounding said through silicon via;
   heat generation of said integrated circuit; and
   heat generation of a region of said one of said wafer layers surrounding said through silicon via.

6. An integrated circuit as claimed in claim 4, wherein said one or more operating parameters are dynamically adjusted during operation of said integrated circuit.

7. An integrated circuit as claimed in claim 4, comprising one or more memory mapped registers configured to be read by software for controlling one or more operating parameters of said integrated circuit and wherein said at least one strain sensor writes a data value indicative of said strain signal to said one or more memory mapped registers.

8. An integrated circuit comprising:
   a stack of wafer layers, each of said wafer layers being separately formed and then stacked to form said stack
   a plurality of through silicon vias, each of said through silicon vias extending through a subject wafer layer and containing a conductive material to provide an electrical connection with an adjacent wafer layer within said stack; and
   at least one strain sensor disposed within one of said wafer layers proximal to a through silicon via, said strain sensor generating a strain signal indicative of mechanical strain associated with said through silicon via within said one of said wafer layers, wherein said one of said wafer layers comprises a plurality of strain sensors disposed proximal to a plurality of through silicon vias.

9. An integrated circuit as claimed in claim 8, wherein strain signals associated with different through silicon vias within said one of said wafer layers are used to identify differences in mechanical strain between different regions within said one of said wafer layers.

10. An integrated circuit comprising:
a stack of wafer layers, each of said wafer layers being separately formed and then stacked to form said stack;
a plurality of through silicon vias, each of said through silicon vias extending through a subject wafer layer and containing a conductive material to provide an electrical connection with an adjacent wafer layer within said stack; and
at least one strain sensor disposed within one of said wafer layers proximal to a through silicon via, said strain sensor generating a strain signal indicative of mechanical strain associated with said through silicon via within said one of said wafer layers, wherein said strain sensor includes a ring oscillator configured such that an oscillation frequency of said ring oscillator varies with said mechanical strain associated with said through silicon via.

11. An integrated circuit comprising:
a stack of wafer layers, each of said wafer layers being separately formed and then stacked to form said stack;
a plurality of through silicon vias, each of said through silicon vias extending through a subject wafer layer and containing a conductive material to provide an electrical connection with an adjacent wafer layer within said stack; and
at least one strain sensor disposed within one of said wafer layers proximal to a through silicon via, said strain sensor generating a strain signal indicative of mechanical strain associated with said through silicon via within said one of said wafer layers, comprising at least one temperature sensor disposed within said one of said wafer layers to monitor temperature changes within said one of said wafer layers.

12. An integrated circuit as claimed in claim 11, wherein heat generation within said one of said wafer layers is controlled to reduce mechanical strain within said one of said wafer layers.

13. An integrated circuit comprising:
a stack of wafer layers, each of said wafer layers being separately formed and then stacked to form said stack;
a plurality of through silicon vias, each of said through silicon vias extending through a subject wafer layer and containing a conductive material to provide an electrical connection with an adjacent wafer layer within said stack; and
at least one strain sensor disposed within one of said wafer layers proximal to a through silicon via, said strain sensor generating a strain signal indicative of mechanical strain associated with said through silicon via within said one of said wafer layers, wherein said strain sensor measures strain in said one of said wafer layers during a manufacturing test operation.

14. An integrated circuit as claimed in claim 13, wherein said measurement of strain during manufacturing test controls sorting of said integrated circuit into a class of integrated circuits have a range of measured mechanical strain characteristics.

15. An integrated circuit comprising:
a stack of wafer layers, each of said wafer layers being separately formed and then stacked to form said stack;
a plurality of through silicon vias, each of said through silicon vias extending through a subject wafer layer and containing a conductive material to provide an electrical connection with an adjacent wafer layer within said stack; and
at least one strain sensor disposed within one of said wafer layers proximal to a through silicon via, said strain sensor generating a strain signal indicative of mechanical strain associated with said through silicon via within said one of said wafer layers, comprising monitoring circuitry configured to receive said strain signal and to measure variation in said strain signal over time.

16. An integrated circuit as claimed in claim 15, wherein said variation provides a measure of at least one of:
wear out of said integrated circuit;
reliability of said integrated circuit;
likelihood of imminent failure of said integrated circuit;
operation of said integrated circuit outside its characterised temperature range;
operation of said integrated circuit outside its characterised voltage range; and
abrupt changes in stress parameters.

17. An integrated circuit comprising:
a stack of wafer layer means, each of said wafer layers being separately formed and then stacked to form said stack;
a plurality of through silicon via means, each of said through silicon via means extending through a subject wafer layer means and containing a conductive material to provide an electrical connection with an adjacent wafer layer means within said stack; and
at least one strain sensing means for sensing strain and disposed within one of said wafer layer means proximal to a through silicon via means, said strain sensor means generating a strain signal indicative of mechanical strain associated with said through silicon via means within said one of said wafer layer means, wherein said strain signal comprises a means for controlling one or more operating parameters of said integrated circuit.

18. A method of operating an integrated circuit having a stack of wafer layers, each of said wafer layers being separately formed and then stacked to form said stack and a plurality of through silicon vias, each of said through silicon vias extending through a subject wafer layer and containing a conductive material to provide an electrical connection with an adjacent wafer layer within said stack, said method comprising the steps of:
providing at least one strain sensor disposed within one of said wafer layers proximal to a through silicon via;
generating with said strain sensor a strain signal indicative of mechanical strain associated with said through silicon via within said one of said wafer layers; and
controlling one or more operating parameters of said integrated circuit in dependence upon said strain signal, wherein said one or more operating parameters are one or more of:
an operating clock frequency of said integrated circuit;
an operating clock frequency of a region of said one of said wafer layers surrounding said through silicon via;
an operating voltage of said integrated circuit;
an operating voltage of a region of said one of said wafer layers surrounding said through silicon via;
heat generation of said integrated circuit; and
heat generation of a region of said one of said wafer layers surrounding said through silicon via.

19. A method of operating an integrated circuit having a stack of wafer layers, each of said wafer layers being separately formed and then stacked to form said stack and a plurality of through silicon vias, each of said through silicon vias extending through a subject wafer layer and containing a conductive material to provide an electrical connection with an adjacent wafer layer within said stack, said method comprising the steps of:

providing at least one strain sensor disposed within one of said wafer layers proximal to a through silicon via;

generating with said strain sensor a strain signal indicative of mechanical strain associated with said through silicon via within said one of said wafer layers; and controlling one or more operating parameters of said integrated circuit in dependence upon said strain signal, wherein said one or more operating parameters are dynamically adjusted during operation of said integrated circuit.

20. A method of operating an integrated circuit having a stack of wafer layers, each of said wafer layers being separately formed and then stacked to form said stack and a plurality of through silicon vias, each of said through silicon vias extending through a subject wafer layer and containing a conductive material to provide an electrical connection with an adjacent wafer layer within said stack, said method comprising the steps of:

providing at least one strain sensor disposed within one of said wafer layers proximal to a through silicon via;

generating with said strain sensor a strain signal indicative of mechanical strain associated with said through silicon via within said one of said wafer layers;

writing a data value indicative of said strain signal to one or more memory mapped registers; and reading said data value from said one or more memory mapped registers with software for controlling one or more operating parameters of said integrated circuit.

21. A method of sorting integrated circuits, said method comprising the steps of:

providing a plurality of integrated circuits, each integrated circuit having a plurality of wafer layers electrically interconnected by a plurality of through silicon vias;

for each integrated circuit of said plurality of integrated circuits, measuring mechanical strain within at least one of said wafer layers of said integrated circuit with a strain sensor formed proximal to a through silicon via;

at least partially in dependence upon said measured mechanical strain, dividing said plurality of integrated circuits into a plurality of classes of integrated circuits having respective different ranges of mechanical strain characteristics; and measuring mechanical strain with a plurality of strain sensors formed proximal to different through silicon vias, wherein said dividing step is performed in dependence upon a maximum measured mechanical strain within an integrated circuit.

* * * * *